US008698479B2

(12) United States Patent
Tung

(10) Patent No.: US 8,698,479 B2
(45) Date of Patent: Apr. 15, 2014

(54) BANDGAP REFERENCE CIRCUIT FOR PROVIDING REFERENCE VOLTAGE

(75) Inventor: Ming-Sheng Tung, Hsinchu (TW)

(73) Assignee: Elite Semiconductor Memory Technology Inc., Hsinchu Science Park, Hsinchu (TW)

(*) Notice: Subject to any disclaimer, the term of this patent is extended or adjusted under 35 U.S.C. 154(b) by 193 days.

(21) Appl. No.: 13/434,856

(22) Filed: Mar. 30, 2012

(65) Prior Publication Data

US 2013/0257396 A1 Oct. 3, 2013

(51) Int. Cl.
*G05F 3/08* (2006.01)
*H01L 37/00* (2006.01)

(52) U.S. Cl.
USPC .......... 323/313

(58) Field of Classification Search
USPC .......... 323/313–316, 907; 327/513, 538–543
See application file for complete search history.

(56) References Cited

U.S. PATENT DOCUMENTS

| | | | | |
|---|---|---|---|---|
| 6,876,250 B2 * | 4/2005 | Hsu et al. | ........ | 327/539 |
| 7,511,567 B2 * | 3/2009 | Yeo et al. | ........ | 327/539 |
| 7,570,107 B2 * | 8/2009 | Kim et al. | ........ | 327/539 |
| 7,581,882 B2 * | 9/2009 | Noguchi | ........ | 374/178 |
| 7,692,418 B2 * | 4/2010 | Jeong | ........ | 323/314 |
| 7,703,975 B2 * | 4/2010 | Kim | ........ | 374/170 |
| 7,863,965 B2 * | 1/2011 | Hwang | ........ | 327/513 |
| 2012/0139523 A1 * | 6/2012 | Kondo | ........ | 323/313 |

* cited by examiner

*Primary Examiner* — Bao Q Vu
*Assistant Examiner* — Zekre Tsehaye
(74) *Attorney, Agent, or Firm* — Winston Hsu; Scott Margo

(57) ABSTRACT

A bandgap reference circuit includes a first circuit, a second circuit and a third circuit. The first circuit is for generating a first current and a first voltage according to a first reference voltage. The second circuit is coupled to the first circuit, for generating a second voltage according to the first voltage. The third circuit is coupled to the first circuit and the second circuit, for generating a voltage offset according to the first current, and generating a bandgap reference voltage according to the second voltage and the voltage offset. The first circuit and the second circuit complement each other for offsetting variations of the bandgap reference voltage due to temperature changes.

6 Claims, 2 Drawing Sheets

BANDGAP REFERENCE CIRCUIT FOR PROVIDING REFERENCE VOLTAGE

BACKGROUND OF THE INVENTION

1. Field of the Invention

The disclosed embodiments of the present invention relate to providing a reference voltage, and more particularly, to a bandgap reference circuit capable of providing a reference voltage having a voltage level below, for example, 1.25V.

2. Description of the Prior Art

A voltage reference generator is an essential design block required in analog and mixed circuits, such as data converters, phase lock-loops (PLL), oscillators, power management circuits, dynamic random access memory (DRAM) and flash memories. A voltage reference generator typically employs a bandgap reference circuit to generate a bandgap reference that is relatively insensitive to temperature, power supply and load variations.

Please refer to FIG. 1, which is a schematic diagram of an exemplary example of a conventional bandgap reference circuit 100. The conventional bandgap reference circuit 100 includes a transistor 110, a resistor 120 and a diode 130. The transistor 110 has a first connection node N1, a second connection node N2 and a control node NC. The resistor 120 has a first end E1 and a second end E2. The diode 130 has an anode and a cathode. The first connection node N1 of the transistor 110 is coupled to a supply voltage VDD, the second connection node N2 of the transistor 110 is coupled to the first end E1 of the resistor 120, and the control node NC of the transistor 110 is coupled to a bias voltage VBS. The second end E2 of the resistor 120 is coupled to the anode of the diode 130. The cathode of the diode 130 is coupled to an electrical ground GND.

The bias voltage VBS controls the transistor 110 to be enabled, thereby generating a proportional-to-absolute-temperature current $I_{PTAT}$. If the value of the resistor 120 is R0, a cross voltage $I_{PTAT}\times R$ will be yielded when the current $I_{PTAT}$ passes through the resistor 120. In this way, an output voltage $V_{out}$ of the bandgap reference circuit 100 may be expressed as follows: $V_{out}=V_{BE}+I_{PTAT}\times R0$, wherein the voltage $V_{BE}$ is the forward bias voltage of the diode 130.

Since the voltage $V_{BE}$ is the forward bias voltage of the diode 130, the voltage $V_{BE}$ has a negative temperature coefficient. That is, the voltage $V_{BE}$ decreases in response to temperature increase, or vice versa. Similarly, the cross voltage $I_{PTAT}\times R$ has a positive temperature coefficient due to the electrical characteristics of both the transistor 110 and the resistor 120. As a result, the output voltage $V_{out}$ of the bandgap reference circuit 100 may be immune to temperature variations when the voltage $V_{BE}$ complements the cross voltage.

The reference voltage outputted from a conventional bandgap reference circuit is usually about 1.25V, however, which is roughly equal to silicon bandgap energy measured at 0K in electron volts, whereas recent IC design typically requires operation regions below 1.25V. Thus, there is a need for an innovative bandgap reference circuit capable of providing a lower reference voltage.

SUMMARY OF THE INVENTION

In accordance with exemplary embodiments of the present invention, a bandgap reference circuit capable of providing a reference voltage having a voltage level below, for example, 1.25V is proposed to solve the above-mentioned problem.

According to a first aspect of the present invention, an exemplary bandgap reference circuit is disclosed. The exemplary bandgap reference circuit includes a first circuit, a second circuit and a third circuit. The first circuit is for generating a first current and a first voltage according to a first reference voltage. The second circuit is coupled to the first circuit, for generating a second voltage according to the first voltage. The third circuit is coupled to the first circuit and the second circuit, for generating a voltage offset according to the first current, and generating a bandgap reference voltage according to the second voltage and the voltage offset. The first circuit and the second circuit complement each other for offsetting variations of the bandgap reference voltage due to temperature changes.

According to a second aspect of the present invention, an exemplary bandgap reference circuit is disclosed. The exemplary bandgap reference circuit includes a proportional-to-absolute-temperature (PATA) circuit, a complementary-to-absolute-temperature (CATA) circuit and an output circuit. The PATA circuit is for generating a PATA voltage according to a first reference voltage. The CATA circuit is coupled to the PATA circuit, for generating a CATA voltage. The output circuit is coupled to the PATA circuit and the CATA circuit, for generating a bandgap reference voltage according to the PATA voltage and the CATA voltage;

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ." Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
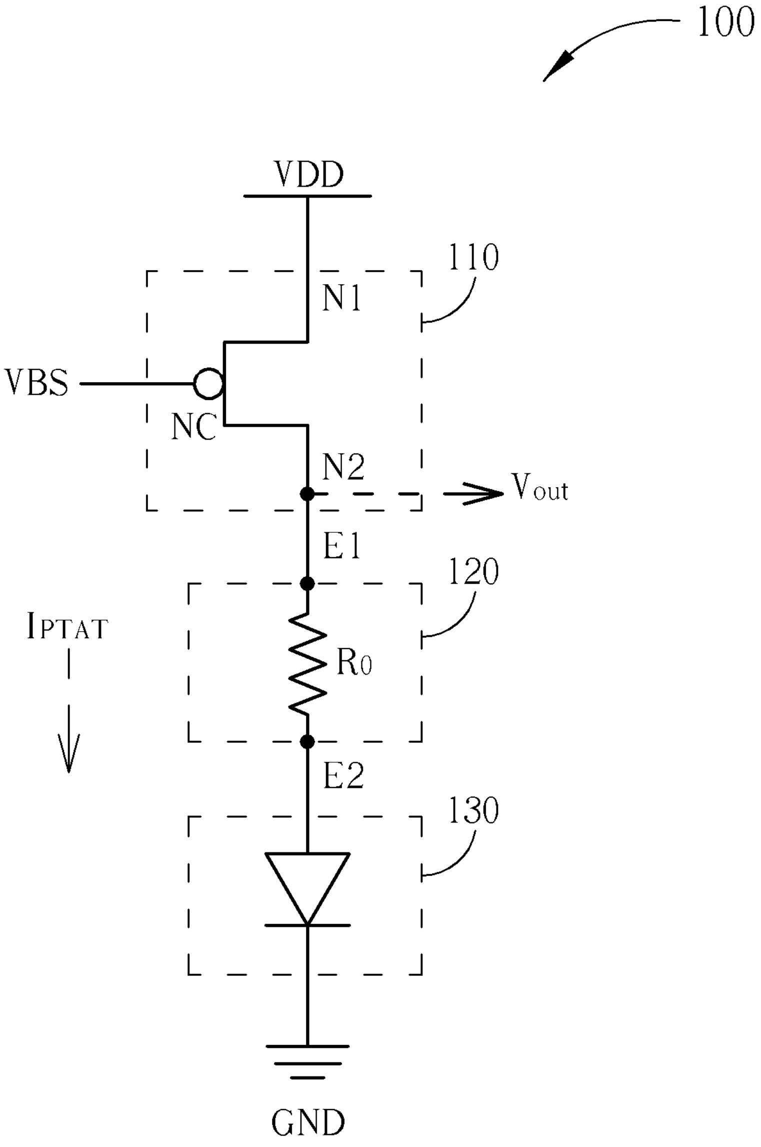
FIG. 1 PRIOR ART
FIG. 1 is a schematic diagram of an exemplary example of a conventional bandgap reference circuit.
Figure 2:
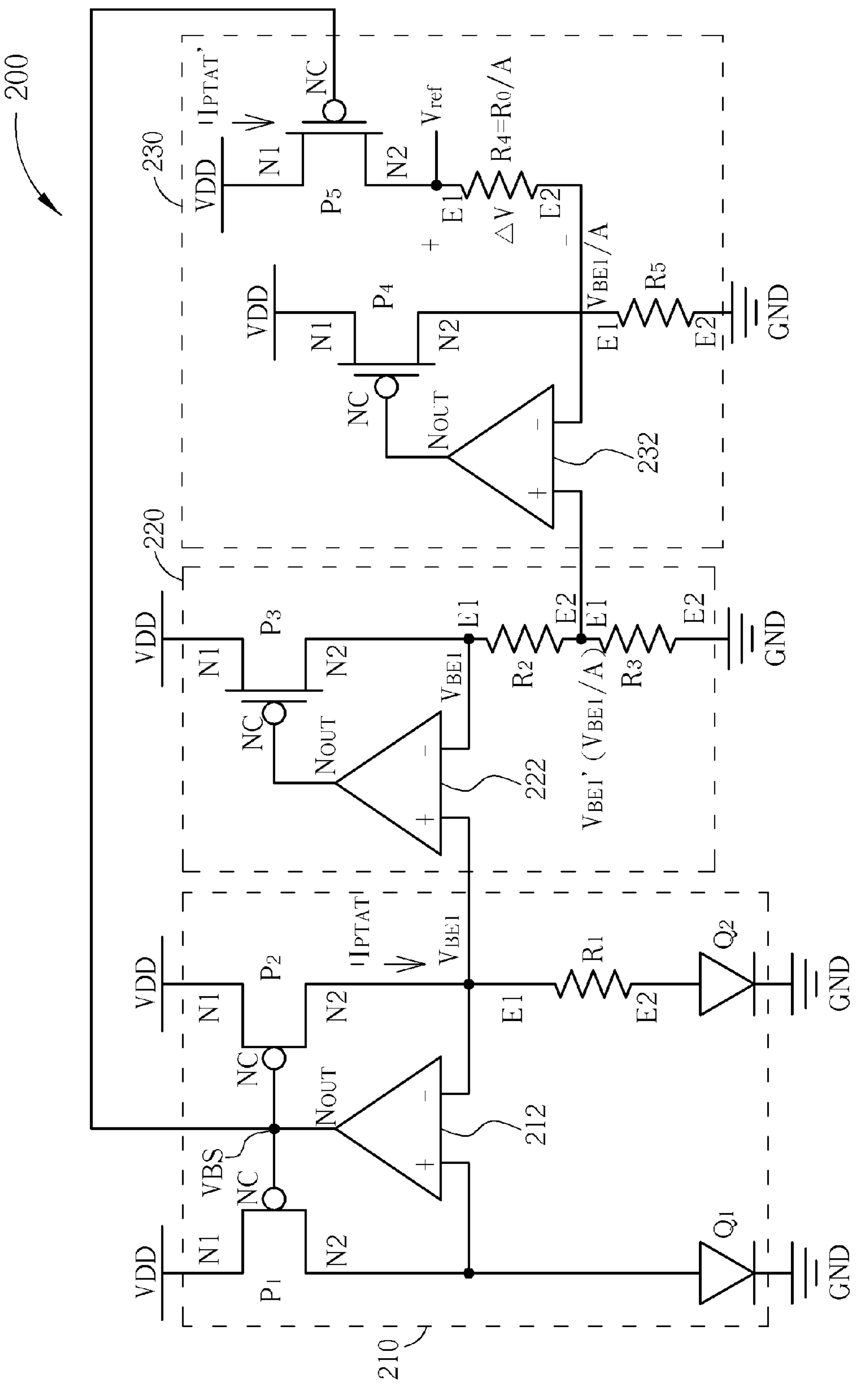
FIG. 2 is a schematic diagram of a bandgap reference circuit according to an exemplary embodiment of the present invention.

Please refer to FIG. 2, which is a schematic diagram of a bandgap reference circuit according to an exemplary embodiment of the present invention. The bandgap reference circuit 200 includes, but is not limited to, a first circuit 210, a second circuit 220 and a third circuit 230. The first circuit 210 is used as a current source for generating an initial proportional-to-absolute-temperature current $I_{PTAT}$ and a voltage $V_{BE1}$ according to a reference voltage VBS. The second circuit 220 is coupled to the first circuit 210, and used as a voltage divider for generating a divided voltage $V_{BE1}'$ according to the voltage $V_{BE1}$. The third circuit 230 is coupled to the first circuit 210 and the second circuit 220, and used for generating a voltage offset ΔV according to a mirrored current $I_{PTAT}'$, and generating a bandgap reference voltage $V_{ref}$ according to the divided voltage $V_{BE1}'$ and the voltage offset ΔV. Further details of the first circuit 210, the second circuit 220 and the third circuit 230 are described in the following.

By way of example, the first circuit 210 may include, but is not limited to, a differential amplifier 212, a plurality of transistors (e.g. PMOS transistors) $P_1$ and $P_2$, a resistor $R_1$, and a plurality of diodes $Q_1$ and $Q_2$. The differential amplifier 212 has a positive input node (+), a negative input node (−) and an output node $N_{OUT}$. Each of the transistors $P_1$ and $P_2$ has a first connection node (e.g. a source terminal) N1, a second connection node (e.g. a drain terminal) N2 and a control node (e.g. agate terminal) NC. The resistor $R_1$ has a first end E1 and a second end E2. Each of the diodes $Q_1$ and $Q_2$ has an anode and a cathode. The first connection node N1 of the transistor $P_1$ is coupled to a supply voltage VDD, the second connection node N2 of the transistor $P_1$ is coupled to the positive input node (+) of the differential amplifier 212, and the control node NC of the transistor $P_1$ is coupled to the output node $N_{OUT}$ of the differential amplifier 212. The first connection node N1 of the transistor $P_2$ is coupled to the supply voltage VDD, the second connection node N2 of the transistor $P_2$ is coupled to the negative input node (−) of the differential amplifier 212, and the control node NC of the transistor $P_2$ is coupled to the output node $N_{OUT}$ of the differential amplifier 212. The first end E1 of the resistor $R_1$ is coupled to the negative input node (−) of the differential amplifier 212. The anode of the diode $Q_1$ is coupled to the positive input node (+) of the differential amplifier 212, and the cathode of the diode $Q_1$ is coupled to an electrical ground GND. The anode of the diode $Q_2$ is coupled to the second end E2 of the resistor $R_1$, and the cathode of the diode $Q_2$ is coupled to the electrical ground GND. This is for illustrative purposes only, however, and not meant to be a limitation of the present invention. In a modification of the above circuit, the diodes $Q_1$ and $Q_2$ may be substituted with bipolar junction transistors (BJTs) in a forward-biased configuration.

By way of example, the second circuit 220 may include, but is not limited to, a differential amplifier 222, a transistor (e.g. a PMOS transistor) $P_3$, and a plurality of resistors $R_2$ and $R_3$. The differential amplifier 222 has a positive input node (+), a negative input node (−) and an output node $N_{OUT}$. The transistor $P_3$ has a first connection node N1, a second connection node N2 and a control node NC. Each of the resistors $R_2$ and $R_3$ has a first end E1 and a second end E2. The positive input node (+) of the differential amplifier 222 is coupled to the negative input node (−) of the differential amplifier 212 for receiving the voltage $V_{BE1}$. The first connection node N1 of the transistor $P_3$ is coupled to the supply voltage VDD, the second connection node N2 of the transistor $P_3$ is coupled to the negative input node (−) of the differential amplifier 222, and the control node NC of the transistor $P_3$ is coupled to the output node $N_{OUT}$ of the differential amplifier 222. The first end E1 of the resistor $R_2$ is coupled to the negative input node (−) of the differential amplifier 222. The first end E1 of the resistor $R_3$ is coupled to the second end E2 of the resistor $R_2$, and the second end E2 of the resistor $R_3$ is coupled to the electrical ground GND. Please note this is for illustrative purposes rather than a limitation of the present invention. Since the primary operation of the second circuit 220 is to "copy" the voltage $V_{BE1}$ and to divide the voltage $V_{BE1}$, the second circuit 220 may be implemented with a voltage follower and a voltage divider, as long as the employed voltage follower and voltage divider are relatively insensitive to temperature variations.

By way of example, the third circuit 230 may include, but is not limited to, a differential amplifier 232, a plurality of transistors $P_4$ and $P_5$, and a plurality of resistors $R_4$ and $R_5$. The differential amplifier 232 has a positive input node (+), a negative input node (−) and an output node $N_{OUT}$. Each of the transistors $P_4$ and $P_5$ has a first connection node N1, a second connection node N2 and a control node NC. Each of the resistors $R_4$ and $R_5$ has a first end E1 and a second end E2. The positive input node (+) of the differential amplifier 232 is coupled to the second end E2 of the resistor $R_2$ for receiving the voltage $V_{BE1}'$. The first connection node N1 of the transistor $P_4$ is coupled to the supply voltage VDD, the second connection node N2 of the transistor $P_4$ is coupled to the negative input node (−) of the differential amplifier 232, and the control node NC of the first transistor $P_4$ is coupled to the output node $N_{OUT}$ of the differential amplifier 232. The first connection node N1 of the transistor $R_5$ is coupled to the supply voltage VDD, and the control node NC of the transistor $R_5$ is coupled to the output node $N_{OUT}$ of the differential amplifier 212 for receiving the bias voltage VBS from the first circuit 210. In other words, the transistors $P_1$, $P_2$ and $P_3$ will be biased by the same gate voltage. The first end E1 of the resistor $R_4$ is coupled to the second connection node N2 of the second transistor $R_5$, and the second end E2 of the resistor $R_4$ is coupled to the negative input node (−) of the differential amplifier 232. The first end E1 of the resistor $R_5$ is coupled to the second end E2 of the resistor $R_4$, and the second end E2 of the resistor $R_5$ is coupled to the electrical ground GND. This is for illustrative purposes only, however, and is not meant to be a limitation of the present invention. Since the transistor $R_4$ merely serves as a load on the feedback path of the differential amplifier 232, the transistor $P_4$ may be replaced with a resister or other kinds of loads.

In this embodiment shown in FIG. 2, the output node $N_{OUT}$ of the differential amplifier 212 outputs the reference voltage VBS which is used to control conductivity of the transistors $P_1$ and $P_2$. The transistors $P_1$ and $P_2$ serve as a current follower in order to generate the current $I_{PTAT}$. Specifically, the differential amplifier 212 is used to adjust the bias voltage of the transistors $P_1$ and $P_2$ each time there is a discrepancy between voltages at the positive input node (+) and the negative input node (−), thereby stabilizing the reference voltage VBS at the output node $N_{OUT}$. In this way, the current $I_{PTAT}$ generated by the first circuit 210 will have a positive temperature coefficient due to the electrical characteristics of the transistor $P_2$; that is, the current $I_{PTAT}$ increases along with the temperature. Hence, the first circuit 210 may be regarded as a proportional-to-absolute-temperature (PTAT) circuit. The voltage $V_{BE1}$ is then yielded by the current $I_{PTAT}$ passing through the resistor $R_1$. Specifically, a cross voltage $I_{PTAT}\times R_1$ will be yielded when the current $I_{PTAT}$ passes through the resistor $R_1$. In this way, the voltage at the negative input node (−) may be expressed as follows: $V_{BE1}=V_{BE}+I_{PTAT}\times R_1$, where the voltage $V_{BE}$ is the forward bias voltage of the diode $Q_2$. Please note that the transistors $P_1$ and $P_2$ should be matched in order to accurately follow the current $I_{PTAT}$.

The voltage $V_{BE1}$ received at the positive input node (+) of the differential amplifier 222 is introduced to the negative input node (−) of the differential amplifier 222 due to a negative feedback configuration of the differential amplifier 222. Specifically, when there is a discrepancy between voltages at the positive input node (+) and negative input node (−) of the differential amplifier 222, the differential amplifier 222 adjusts the bias voltage provided to the control node NC of the transistor $P_3$ for increasing/decreasing the current passing through the transistor $P_3$ and the resistors $R_2$ and $R_3$, thereby forcing the voltage at the negative input node (−) of the differential amplifier 222 to follow the voltage (i.e. $V_{BE1}$) at the positive input node (+) of the differential amplifier 222. The voltage $V_{BE1}$ introduced at the negative input node (−) of the differential amplifier 222 is then fed into a voltage divider constituted by the resistors $R_2$ and $R_3$. In a case where $(R_2+R_3)/R_3=A$, the divided voltage $V_{BE1}'$ is equal to the voltage $V_{BE1}$ divided by the ratio A. The voltage $V_{BE1}'$ generated via the voltage $V_{BE1}$ will have a negative temperature coefficient since the resistors $R_2$ and $R_3$ have a small/negligible temperature dependency, and the voltage $V_{BE1}$ has a negative temperature coefficient. That is, the voltage $V_{BE1}'$ decreases while the temperature increases. The second circuit 220 may be regarded as a complementary-to-absolute-temperature (CATA) circuit.

In addition, the transistor $P_5$ serves as a current mirror which mirrors the current $I_{PTAT}$, and the mirrored current $I_{PTAT}'$ passes through the resistor $R_4$, thereby yielding the voltage offset ΔV. In equation form, $\Delta V=I_{PTAT}\times R_4=I_{PTAT}\times R_0/A$. In this embodiment, the resistance value of the resistor $R_4$ is equal to the resistance value of the resistor $R_0$ divided by the ratio A (i.e., $R_4=R_0/A$). $R_0$ is the resistance of resistor 120. The voltage $V_{BE1}'$ received at the positive input node (+) of the differential amplifier 232 is introduced to the negative input node (−) of the differential amplifier 232 due to a negative feedback configuration of the differential amplifier 232. Specifically, when there is a discrepancy between voltages at the positive input node (+) and negative input node (−) of the differential amplifier 232, the differential amplifier 232 adjusts the bias voltage provided to the control node NC of the transistor $P_4$ for increasing/decreasing the current passing through the transistor $P_4$, thereby forcing the voltage at the negative input node (−) of the differential amplifier 232 to follow the voltage (i.e., $V_{BE1}'$) at the positive input node (+) of the differential amplifier 232. The third circuit 230 may be regarded as an output circuit which combines the voltage offset ΔV and the voltage $V_{BE1}'$ in order to output the bandgap reference voltage $V_{ref}$. In equation form, $V_{ref}=V_{BE1}'+\Delta V=V_{BE1}/A+I_{PTAT}\times R_0/A=(V_{BE1}+I_{PTAT}\times R_0)/A$. Compared to the conventional design which generates a reference voltage $V_{out}=V_{BE}+I_{PTAT}\times R$, the proposed design is capable of providing a lower bandgap reference voltage $V_{ref}$ by properly setting the ratio A.

Please note that only the transistors $P_5$ and $P_2$ are required to be matched in order to accurately mirror the current $I_{PTAT}'$ from the current $I_{PTAT}$ while the transistors $P_3$ and $P_4$ do not need to match other transistors. This greatly simplifies the implementation of the bandgap reference circuit 200.

In short, the spirit of the present invention is to combine a CATA voltage (e.g. the voltage $V_{BE1}'$) and a PATA voltage (e.g. the voltage offsetΔV), in order to generate a temperature insensitive bandgap reference voltage. Since the CATA voltage and the PATA voltage are both scaled by the ratio A, the bandgap reference voltage may be controlled below 1.25V. Therefore, the proposed bandgap reference circuit 200 is capable of providing a reference voltage below 1.25V to meet the requirements of an application with an operation region below 1.25V.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bandgap reference circuit, comprising:

a first circuit, for generating a first current and a first voltage according to a first reference voltage;

a second circuit, coupled to the first circuit, for generating a second voltage according to the first voltage; and a third circuit, coupled to the first circuit and the second circuit, for generating a voltage offset according to the first current, and generating a bandgap reference voltage according to the second voltage and the voltage offset;

wherein the first circuit and the second circuit complement each other for offsetting variations of the bandgap reference voltage due to temperature changes;

wherein the third circuit comprises:

a first differential amplifier, having a positive input node, a negative input node and an output node, the positive input node of the first differential amplifier for receiving the second voltage generated from the second circuit;

a first transistor, having a first connection node, a second connection node and a control node, the second connection node of the first transistor is coupled to the negative input node of the first differential amplifier, the first connection node of the first transistor is coupled to the first reference voltage, and the control node of the first transistor is coupled to the output node of the first differential amplifier;

a second transistor, having a first connection node, a second connection node and a control node, the first connection node of the second transistor is coupled to the first reference voltage, and the control node of the second transistor is for receiving a bias voltage from the first circuit;

a first resistor, having a first end and a second end, the first end of the first resistor is coupled to the second connection node of the second transistor, and the second end of the first resistor is coupled to the negative input node of the first differential amplifier; and a second resistor, having a first end and a second end, the first end of the second resistor is coupled to the second end of the first resistor, and the second end of the second resistor is coupled to a second reference voltage;

wherein the second circuit comprises:

a second differential amplifier, having a positive input node, a negative input node and an output node, the positive input node of the second differential amplifier for receiving the first voltage generated from the first circuit;

a third transistor, having a first connection node, a second connection node and a control node, the second connection node of the third transistor is coupled to the negative input node of the second differential amplifier, the first connection node of the third transistor is coupled to the first reference voltage, and the control node of the third transistor is coupled to the output node of the second differential amplifier;

a third resistor, having a first end and a second end, the first end of the third resistor is coupled to the negative input node of the second differential amplifier, the second end of the third resistor is coupled to the positive input node of the first differential amplifier; and a fourth resistor, having a first end and a second end, the first end of the fourth resistor is coupled to the second end of the third resistor, and the second end of the fourth resistor is coupled to the second reference voltage;

wherein the first circuit comprises:

a third differential amplifier, having a positive input node, a negative input node and an output node, the negative input node of the third differential amplifier is coupled to the positive input node of the second differential amplifier, and the output node of the third differential amplifier is coupled to the control node of the second transistor;

a fourth transistor, having a first connection node, a second connection node and a control node, the first connection node of the fourth transistor is coupled to the first reference voltage, the second connection node of the fourth transistor is coupled to the positive input node of the third differential amplifier, and the control node of the fourth transistor is coupled to the output node of the third differential amplifier;

a fifth transistor, having a first connection node, a second connection node and a control node, the second connection node of the fifth transistor is coupled to the negative input node of the third differential amplifier, the first connection node of the fifth transistor is coupled to the first reference voltage, and the control node of the fifth transistor is coupled to the output node of the third differential amplifier;

a fifth resistor, having a first end and a second end, the first end of the fifth resistor is coupled to the negative input node of the first differential amplifier;

a first diode, having an anode and a cathode, the anode of the first diode is coupled to the positive input node of the third differential amplifier, and the cathode of the first diode is coupled to a second reference voltage; and a second diode, having an anode and a cathode, the anode of the second diode is coupled to the second end of the fifth resistor, and the cathode of the second diode is coupled to the second reference voltage.

2. The bandgap reference circuit of claim 1, wherein the first circuit is a proportional-to-absolute-temperature (PATA) circuit.

3. The bandgap reference circuit of claim 1, wherein the second circuit is a complementary-to-absolute-temperature (CATA) circuit.

4. The bandgap reference circuit of claim 1, wherein the first reference voltage is lower than 1.25 volts.

5. A bandgap reference circuit, comprising:

a proportional-to-absolute-temperature (PATA) circuit, for generating a PATA voltage according to a first reference voltage;

a complementary-to-absolute-temperature (CATA) circuit, coupled to the PATA circuit, for generating a CATA voltage; and an output circuit, coupled to the PATA circuit and the CATA circuit, for generating a bandgap reference voltage according to the PATA voltage and the CATA voltage;

wherein the output circuit comprises:

a first differential amplifier, having a positive input node, a negative input node and an output node, the positive input node of the first differential amplifier for receiving the CATA voltage generated from the CATA circuit;

a first transistor, having a first connection node, a second connection node and a control node, the second connection node of the first transistor is coupled to the negative input node of the first differential amplifier, the first connection node of the first transistor is coupled to the first reference voltage, and the control node of the first transistor is coupled to the output node of the first differential amplifier;

a second transistor, having a first connection node, a second connection node and a control node, the first connection node of the second transistor is coupled to the first reference voltage, and the control node of the second transistor is for receiving a bias voltage from the PATA circuit;

a first resistor, having a first end and a second end, the first end of the first resistor is coupled to the second connection node of the second transistor, and the second end of the first resistor is coupled to the negative input node of the first differential amplifier; and a second resistor, having a first end and a second end, the first end of the second resistor is coupled to the second end of the first resistor, and the second end of the second resistor is coupled to a second reference voltage;

wherein the CATA circuit comprises:

a second differential amplifier, having a positive input node, a negative input node and an output node, the positive input node of the second differential amplifier for receiving the first voltage generated from the first circuit;

a third transistor, having a first connection node, a second connection node and a control node, the second connection node of the third transistor is coupled to the negative input node of the second differential amplifier, the first connection node of the third transistor is coupled to the first reference voltage, and the control node of the third transistor is coupled to the output node of the second differential amplifier;

a third resistor, having a first end and a second end, the first end of the third resistor is coupled to the negative input node of the second differential amplifier, and the second end of the third resistor is coupled to the positive input node of the first differential amplifier; and a fourth resistor, having a first end and a second end, the first end of the fourth resistor is coupled to the second end of the third resistor, and the second end of the fourth resistor is coupled to the second reference voltage;

wherein the PATA circuit comprises:

a third differential amplifier, having a positive input node, a negative input node and an output node, the negative input node of the third differential amplifier is coupled to the positive input node of the second differential amplifier, and the output node of the third differential amplifier is coupled to the control node of the second transistor;

a fourth transistor, having a first connection node, a second connection node and a control node, the first connection node of the fourth transistor is coupled to the first reference voltage, the second connection node of the fourth transistor is coupled to the positive input node of the third differential amplifier, and the control node of the fourth transistor is coupled to the output of the third differential amplifier;

a fifth transistor, having a first connection node, a second connection node and a control node, the first connection node of the fifth transistor is coupled to a negative input node of the third differential amplifier, the second connection node of the fifth transistor is coupled to the first reference voltage, and the control node of the fifth transistor is coupled to the output node of the third differential amplifier;

a fifth resistor, having a first end and a second end, the first end of the fifth resistor is coupled to the negative input node of the first differential amplifier;

a first diode, having an anode and a cathode, the anode of the first diode is coupled to the positive input node of the third differential amplifier, and the cathode of the first diode is coupled to a second reference voltage; and a second diode, having an anode and a cathode, the anode of the second diode is coupled to the second end of the fifth resistor, and the cathode of the second diode is coupled to the second reference voltage.

6. The bandgap reference circuit of claim 5, wherein the first reference voltage is lower than 1.25 volts.

* * * * *